US008435597B2

(12) United States Patent
Koide et al.

(10) Patent No.: US 8,435,597 B2
(45) Date of Patent: May 7, 2013

(54) DIAMOND UV-SENSOR ELEMENT AND MANUFACTURING METHOD THEREOF, UV-SENSOR UNIT, AND METHOD OF TREATING DIAMOND SINGLE CRYSTAL

(75) Inventors: Yasuo Koide, Tsukuba (JP); Meiyong Liao, Tsukuba (JP); Jose Alvarez, Gif sur Yvette Cedex (FR); Jean-Paul Kleider, Gif sur Yvette Cedex (FR)

(73) Assignees: National Institute for Materials Science, Ibaraki (JP); Centre National de la Recherche Scientifique, Paris Cedex (FR)

( * ) Notice: Subject to any disclaimer, the term of this patent is extended or adjusted under 35 U.S.C. 154(b) by 402 days.

(21) Appl. No.: 12/866,554

(22) PCT Filed: Feb. 9, 2009

(86) PCT No.: PCT/JP2009/052172
§ 371 (c)(1),
(2), (4) Date: Nov. 15, 2010

(87) PCT Pub. No.: WO2009/099233
PCT Pub. Date: Aug. 13, 2009

(65) Prior Publication Data
US 2011/0045173 A1 Feb. 24, 2011

(30) Foreign Application Priority Data
Feb. 7, 2008 (JP) ................. 2008-027232

(51) Int. Cl.
*B05D 5/00* (2006.01)
(52) U.S. Cl.
USPC .......................................... 427/162; 356/51
(58) Field of Classification Search .............. 427/162; 356/51
See application file for complete search history.

(56) References Cited

U.S. PATENT DOCUMENTS

| 4,925,701 A | * | 5/1990 | Jansen et al. ................. 427/575 |
| 2004/0182308 A1 | * | 9/2004 | Scarsbrook et al. ............ 117/68 |

FOREIGN PATENT DOCUMENTS

| JP | 11-97721 | 4/1999 |
| JP | 11-248531 | 9/1999 |
| JP | 2002-223016 | 8/2002 |
| JP | 2004-109020 | 4/2004 |
| JP | 2005-310963 | 11/2005 |
| WO | 2007/015431 | 2/2007 |

OTHER PUBLICATIONS

Riedel et al Diamond and related materials, 13(2004)746-750.*
International Search Report issued May 19, 2009 in corresponding International Application No. PCT/JP2009/052172.
M. Riedel et al., "The impact of ozone on the surface conductivity of single crystal diamond", Diamond and Related Materials, vol. 13, Feb. 2004, pp. 746-750.

* cited by examiner

*Primary Examiner* — Michael Cleveland
*Assistant Examiner* — Tabassom Tadayyon Eslami
(74) *Attorney, Agent, or Firm* — Wenderoth, Lind & Ponack, L.L.P.

(57) ABSTRACT

A method of manufacturing a diamond UV sensor element improved with a UV/visible light blind ratio using a diamond single crystal as a light receiving portion and detecting a light based on the change of electric resistance caused by a light irradiated to the light receiving portion is provided, the method, including (1) a step of hydrogenating the surface of the diamond single crystal in an atmosphere substantially containing hydrogen, and (2) a step of forming a light receiving portion by exposing the hydrogenated surface of the diamond single crystal into an atmosphere containing ozone or active oxygen.

2 Claims, 6 Drawing Sheets

DIAMOND UV-SENSOR ELEMENT AND MANUFACTURING METHOD THEREOF, UV-SENSOR UNIT, AND METHOD OF TREATING DIAMOND SINGLE CRYSTAL

TECHNICAL FIELD

The present invention relates to a diamond UV-sensor element and a manufacturing method thereof, a UV-sensor unit, and a method of treating a diamond single crystal.

BACKGROUND ART

Since diamond has a large band gap, it has been known to use a diamond single crystal film as a light receiving portion of a UV-sensor element. For example, it has been known so far to manufacture a diamond single crystal film the surface of which is substantially covered with hydrogen atoms (hereinafter also referred to as "hydrogenation") by a microwave-excited plasma vapor deposition method using methane and a hydrogen gas and utilize the same as a light receiving portion (for example, refer to Patent documents 1, 2). Further, as another example, a diamond film UV-sensor having a UV detection layer in which oxygen is chemically adsorbed to the surface of a diamond film oriented and grown monoaxially by vapor phase synthesis (hereinafter also referred to as "oxygenation") has also been proposed (for example, refer to Patent document 3).

By the way, an important index of a light receiving portion material in the UV sensor element includes a ratio between the value of a photocurrent flowing under UV irradiation and a value of photocurrent flowing under the irradiation of a visible light (hereinafter also referred to as "UV/visible light blind ratio"). Since a UV sensor element of higher sensitivity can be attained as the value is larger, it is actually demanded to have a larger value.

Patent Document 1: JP-A No. 2005-310963
Patent Document 2: JP-A No. 11(1999)-097721
Patent Document 3: JP-A No. 11(1999)-248531

DISCLOSURE OF INVENTION

However, in the diamond film hydrogenated at the surface, since a large dark current flows, the UV/visible light blind ratio decreases relatively. On the other hand, when oxygen is adsorbed to the diamond surface, the surface current on the surface of the diamond film is suppressed and the dark current decreases extremely. However, the photocurrent value upon UV irradiation also decreases and, as a result, the UV/visible light blind ratio becomes smaller.

The present invention has been achieved in view of the situations described above and it is an object thereof to provide a diamond UV sensor element with an improved UV/visible light blind ratio and a manufacturing method thereof, a UV sensor unit, and a method of treating a diamond single crystal.

For solving the subject described above, the present invention has the following features.

At first, the present invention provides a method of manufacturing a diamond UV sensor element using a diamond single crystal as a light receiving portion and detecting a light based on the change of electric resistance caused by a light irradiated to the light receiving portion, including (1) a step of hydrogenating the surface of a diamond single crystal in an atmosphere substantially containing hydrogen, and (2) a step of forming a light receiving portion by exposing the surface of the hydrogenated diamond single crystal into an atmosphere containing ozone or active oxygen.

Secondly, the step (2) is carried out in an atmosphere containing ozone or active oxygen generated by introducing an oxygen gas into a chamber containing the diamond single crystal hydrogenated at the surface and irradiating a UV light thereto.

Thirdly, the diamond single crystal is a diamond single crystal film disposed on the substrate.

Fourthly, the present invention provides a diamond UV sensor element in which a diamond single crystal is formed as a light receiving portion on a substrate and which detects a light based on the change of electric resistance caused by a light irradiated to the light receiving portion, wherein the light receiving portion is formed by exposing the diamond single crystal hydrogenated at the surface in an atmosphere containing ozone or active oxygen.

Fifthly, in the UV-sensor unit of the present invention, the diamond UV-sensor element is constituted as a portion thereof.

Sixthly, the present invention concerns a method of treating a diamond single crystal, including (1) a step of hydrogenating the surface of the diamond single crystal in an atmosphere substantially containing hydrogen, and (2) a step of exposing the hydrogenated surface of the diamond single crystal in an atmosphere containing ozone or active oxygen.

Seventhly, the step (2) of the sixth invention described above is carried out by generating ozone or active oxygen by irradiation of a UV light to an oxygen gas, and exposing the hydrogenated surface of the diamond single crystal under an atmosphere containing the ozone or active oxygen.

Eighthly, the intensity of the UV light or the irradiation time of the UV light is controlled in the seventh invention thereby controlling the concentration of bonded hydrogen on the surface of the diamond single crystal.

EXPLANATION OF REFERENCES

1 Electrode
2 Light receiving portion

BEST MODE FOR CARRYING OUT THE INVENTION

Figure 1:
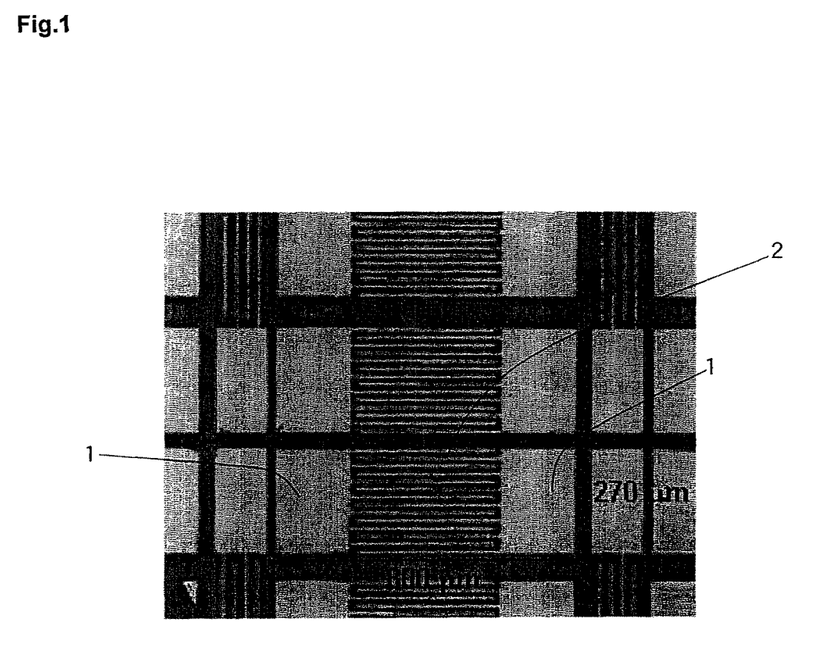
FIG. 1 is a photograph for the surface of a device having a comb-type electrode structure.

In the present invention, the diamond UV sensor element is configured by forming a light receiving portion for detecting a UV light on a substrate and, further, forming a pair of comb-type electrodes 2, for example, as shown in FIG. 1 so as to be in contact with the light receiving portion. In FIG. 1, a light receiving portion 2 is present between the comb-type electrodes 1 paired to each other. The light receiving portion is formed, for example, by subjecting the surface of a diamond single crystal film laminated on the substrate or the surface of a diamond single crystal substrate to a treatment to be described later, specifically, a hydrogenation treatment and an ozone treatment.

The method of manufacturing a diamond UV sensor element of the invention is characterized by including (1) a step of hydrogenating the surface of a diamond single crystal in an atmosphere substantially containing hydrogen and (2) a step of forming a light receiving portion by exposing the hydrogenated surface of the diamond single crystal to an atmosphere containing ozone or active oxygen.

The diamond single crystal in the hydrogenation treatment step (1) described above may be, for example, a diamond single crystal film formed on a substrate or a diamond single crystal substrate. The diamond single crystal film can be synthesized on a diamond single crystal substrate by known vapor phase synthesis methods such as a microwave-excited plasma vapor deposition method (for example, refer to JP-B No. Sho 59-27754), a radio frequency plasma CVD method, a direct current plasma CVD method, etc. Hydrogenation for the surface of the diamond single crystal film can be attained, for example, accompanying the synthesis of the diamond single crystal film by the microwave-excited plasma vapor deposition method. That is, since the vapor deposition method is a vapor deposition method in a hydrogen gas containing atmosphere, a C-H molecular structure in which unbonded hands of the carbon atoms (C) are bonded and terminated with hydrogen atoms (H) are present on the surface of the diamond epitaxial layer grown by the method. On the other hand, hydrogenation for the surface of a diamond single crystal substrate not having such a hydrogenated epitaxial layer can be attained by a treatment in a hydrogen containing atmosphere using the same apparatus as that for the vapor deposition method. it has been known that a two-dimensional surface conductive layer where holes as carriers are localized in the diamond near the surface is generated along with the hydrogenation. The generation mechanism of the surface conductive layer has now been in worldwide controversy in academic society and is not apparent at present. However, it has been known at least experimentarily that the surface conductive layer (1) exists stably at up to about 200° C. of an atmospheric temperature, (2) is generated only on the hydrogenated diamond surface, and (3) the surface resistance of the surface conductive layer is from 5 to 10 kΩ/□. It is also known that the surface conductive layer is eliminated by the treatment of removing bonded hydrogen at the surface (oxidation treatment), for example, by applying a treatment of dipping into a boiled liquid mixture of sulfuric acid and nitric acid. That is, it can be judged whether the diamond surface is hydrogenated or not by observing the presence or absence of the electroconductive layer on the diamond surface.

In step (2) of the ozone or active oxygen treatment described above, the hydrogenated surface of the diamond single crystal is subjected to an oxidation treatment, for example, by exposing the surface in an atmosphere containing ozone and/or active oxygen along with a UV light of a low pressure mercury lamp at a room temperature for about 5 minutes to 50 hours. Such a treatment is hereinafter also referred to simply as an ozone treatment. Ozone or active oxygen can be generated by introducing an oxygen ($O_2$) gas in an ozone treatment apparatus in which the hydrogenated diamond single crystal is disposed and irradiating a UV light to the oxygen ($O_2$) gas or performing silent electric discharge.

More specifically, it is considered that ozone ($O_3$) and active oxygen (O) is generated through the following reaction process by the irradiation of a UV light of a low pressure mercury lamp to the oxygen ($O_2$) gas.

Wavelength 184.9 nm $$O_2 \leftrightarrows O_3 \text{ (ozone)} \qquad (1)$$

Wavelength 253.7 nm $$O_3 \leftrightarrows O \text{ (active oxygen)} + O_2 \qquad (2)$$

The generated ozone and active oxygen react with the bonded hydrogen on the surface of the diamond to form volatile molecules ($CO_2$, $H_2O$, etc.) which are detached from the diamond surface. Then, it is considered that unbonded hands are bonded by oxygen (O), oxygen hydrogen molecule (OH), etc.

The ozone treatment in the invention has an advantage that the reaction rate of the reaction formulae (1) and (2) described above can be controlled by controlling the intensity of the UV light or the irradiation time of the UV light to the oxygen ($O_2$) gas, thereby capable of controlling the concentration of bonded hydrogen (CH) on the diamond surface. Accordingly, the surface resistance of the surface conductive layer on the diamond surface can be controlled and the UV light/visible light blind ratio of the UV light sensor can be controlled easily. That is, since the hole concentration in the conductive layer on the diamond surface is in proportion with the CH concentration on the surface, the hole concentration decreases by the conversion of the bonding state on the diamond surface into CO or COH. When the hydrogenated surface of the diamond single crystal is subjected to oxygenation, it may be considered, for example, a method of treatment with a mixed acid solution boiled at 190 to 230° C. in addition to the ozone treatment described above. However, this treatment method involves such a drawback that it is difficult to completely remove bonded hydrogen on the surface of the diamond single crystal and it is difficult to terminate unbonded hands on the surface of the diamond single crystal with oxygen atoms by atom imaging. The ozone treatment in the present invention is a processing of enabling termination of oxygen atoms or oxygen hydrogen molecules at the same time with cleaning for the surface of the diamond single crystal and capable of overcoming the drawback described above.

By the ozone treatment of the diamond single crystal hydrogenated at the surface thereof as described above, the present invention can increase the UV/visible light blind ratio of the thus obtained diamond UV sensor element by about 1 to 3 digits when compared with that of the existent diamond UV sensor element using the hydrogenated diamond single crystal film as the light receiving portion. Further, the photosensitivity and the response speed of the diamond UV sensor element can also be controlled by controlling the ozone treatment time.

The diamond UV sensor element obtained as described above can be used, for example, as a combustion control monitor for industrial combustion furnaces, gas turbine engines, jet engines, etc., a flame sensor for flame detectors in association with fire detectors, or a UV sensor in UV light irradiation apparatus.

Descriptions are to be made more specifically with reference to an example. It is apparent that the present invention is not restricted by the following example.

EXAMPLE

<Preparation of Surface Hydrogenated Diamond Single Crystal Film>

A diamond epitaxial single crystal film was grown on an lb type (100) plane oriented diamond single crystal substrate by a microwave plasma chemical vapor deposition (MPCVD) method. The deposition conditions are as described below.

Underlayer substrate: lb type (100) plane oriented diamond single crystal substrate (manufactured by Element Six Ltd.)
Starting material gas: methane ($CH_4$), flow rate: 0.4 sccm
Carrier (dilution) gas: hydrogen ($H_2$), flow rate: 500 sccm
$CH_4/H_2$ concentration ratio: 0.08% (vol)
Pressure during deposition: 80 Torr
Microwave power: 400 W
Substrate temperature: 930° C.
Deposition time: 4 hrs.
Thickness of epitaxial single crystal film: 0.25 μm After the completion of deposition, that is, after stopping the supply of the methane gas, the epitaxial single crystal film was kept at a substrate temperature for 10 minutes under a hydrogen atmosphere.

By the method described above, a diamond epitaxial single crystal film hydrogenated at the surface is obtained. For a diamond single crystal substrate not having the epitaxial single crystal film, a diamond single crystal substrate hydrogenated at the surface can be obtained by carrying out a hydrogenation treatment under the following conditions using the same deposition apparatus as described above.

Microwave power: 400 W
Hydrogen ($H_2$) flow rate: 500 sccm
Substrate temperature: 900° C.
Treatment time: 1 hr <Manufacture of Device (Diamond UV Sensor Element)>

A resist was patterned on the diamond epitaxial single crystal film prepared as described above for fabricating a comb-type electrode structure using WC and WC/Au ("/" shows herein order of lamination) as an electrode material. Then, WC as a first layer and, successively, Au as a second layer were laminated and deposited by sputtering of WC and Au target materials by a sputtering method and an electrode was fabricated by a lift off method. FIG. 1 is a surface photograph of a fabricated device of the comb-type electrode structure. In the drawing, a black portion is a diamond epitaxial single crystal film as the light receiving portion 2. The size of the device was 270 μm×800 μm and the distance between the comb-type electrodes 1 was 10 μm.

<Ozone Treatment>

An ozone treatment was carried out for the device described above. The ozone treatment was carried out at a room temperature by using a commercially available UV ozone cleaner (UV/253 type, Nippon Laser & Electronics Laboratory) apparatus. In the process, an oxygen gas ($O_2$) was at first introduced for removing air in an ozone cleaner chamber (200×207×142 mm). By irradiating a UV light at an intensity of 3.7 mW/cm$^2$ by using a low pressure mercury lamp, ozone ($O_3$) and active oxygen (O) were generated by way of the reaction formulae (1) and (2) from oxygen in the chamber.

The oxygen gas was introduced into the chamber by flowing the oxygen gas continuously for a certain period of time into the chamber thereby filling the inside of the chamber with oxygen. Then, for generating ozone ($O_3$) and active oxygen (O) by way of the reaction formulae (1) and (2), a UV light is irradiated in the chamber and the device having a sensor fabricated on the hydrogenated surface of the diamond is disposed in one identical chamber, thereby irradiating the UV light of a low pressure mercury lamp and, at the same time, carrying out the ozone treatment.

In the process, no additional oxygen gas was introduced into the chamber. The ozone treatment time was varied in a range of several minutes to several tens hours. The ozone treatment time is a time of irradiating the UV light to the oxygen gas introduced into the chamber.

<Result of Electric-Optical Characteristics>

Figure 2:
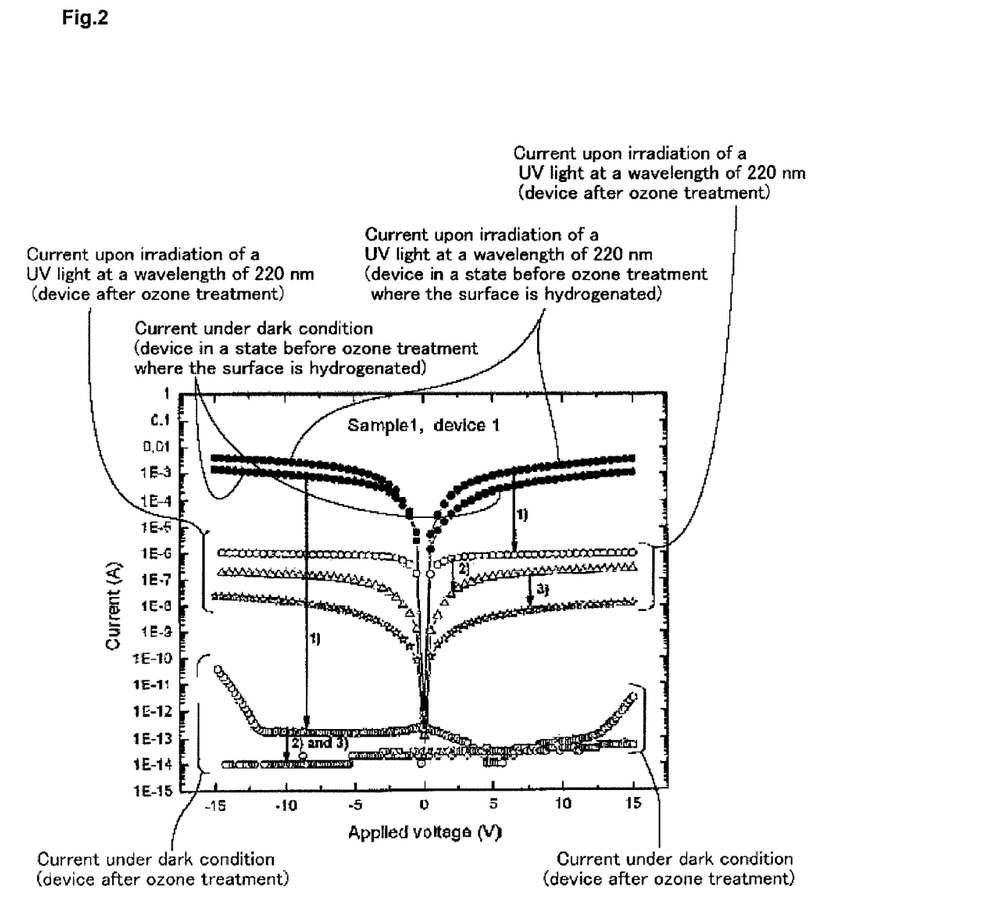
FIG. 2 is a graph showing current-applied voltage characteristics upon irradiation of a UV light at a wavelength of 220 nm and under dark condition of a device in an example.

For the device after the ozone treatment described above, a relation between a dark current (current value in a state with no light irradiation) and a photocurrent upon UV light irradiation, and the applied voltage was examined. FIG. 2 shows current-applied voltage characteristics upon UV light irradiation at a wavelength of 220 nm and under dark condition. In FIG. 2, black circles show data of a device before the ozone treatment where the surface is hydrogenated, and data shown by arrows 1), 2), 3) show data for the device applied with ozone treatment for 80 minutes, 4 hours, and 24 hours, respectively. In the data for the current under the dark condition, data shown by arrows 2) and 3) are identical and they are below the detection limit.

As shown in the graph, the ozone treatment not only decreases the photocurrent value upon UV light irradiation but further decreases the dark current. That is, this increases the difference of the current value between UV light ON/OFF states. It has been confirmed that the current value in the UV light ON/OFF state was worsened extremely at the hydrogenated surface after the deposition since the hydrogenated surface has electroconductivity.

Figure 3:
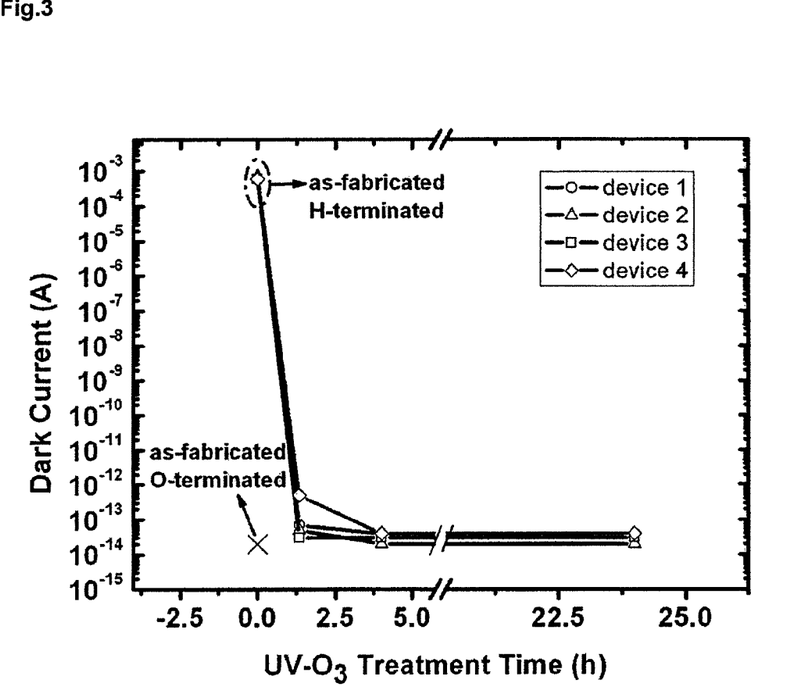
FIG. 3 is a graph showing the change of a dark current to an ozone treatment time of the device in the example.
Figure 4:
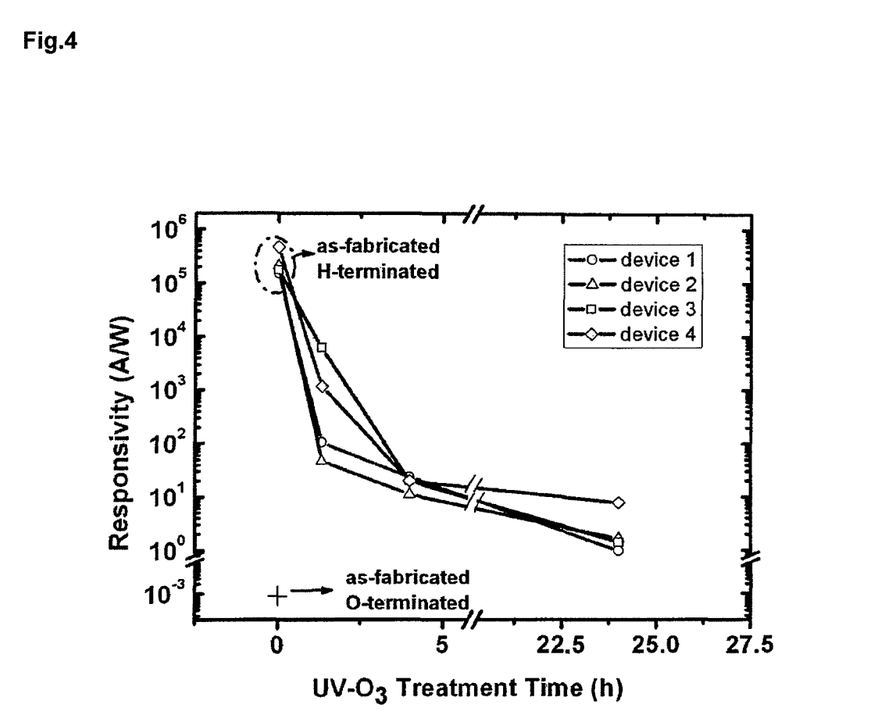
FIG. 4 is a graph showing the change of a photosensitivity of the device to the ozone treatment time of the example.

Then, for four devices after the ozone treatment, the change of the dark current and that of the photosensitivity to the ozone treatment time were investigated. FIG. 3 shows the change of the dark current to the ozone treatment time and FIG. 4 shows the change of the photosensitivity to the ozone treatment time. The photosensitivity was converted based on the photocurrent value upon irradiation of a light at 220 nm. The ozone treatment time was defined as 80 minutes, 4 hours, and 24 hours. Further, the dark current and the photosensitivity were measured also for the device in a state before the ozone treatment where the surface was hydrogenated, and the device in a state where the surface was subjected to the oxygenation treatment.

In view of the results of FIG. 3 and FIG. 4, the device in a state hydrogenated at the surface shows large dark current (~$6 \times 10^{-4}$ A, FIG. 3) and photosensitivity (>$5 \times 10^5$ A/W, FIG. 4). After the ozone treatment for 80 minutes, the dark current is drastically decreased by about 10 digits. On the other hand, the photosensitivity decreases by about 1 to 3 digits while this depends on the device. When the ozone treatment is further carried out continuously, while the dark current scarcely changes by the ozone treatment, the photosensitivity further decreases to 4 to 20 NW (FIG. 4). It can be seen that the value of the photosensitivity is kept at a considerably larger value compared with the photosensitivity value of $1 \times 10^{-3}$ A/W at the oxygenated surface shown by the symbol (+) in FIG. 4.

Figure 5:
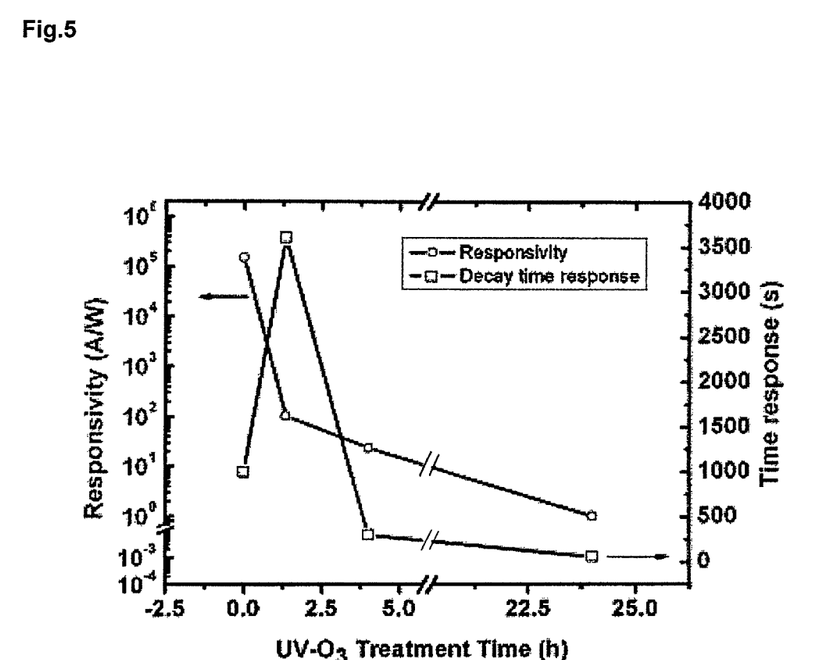
FIG. 5 is a graph showing the dependence of the photosensitivity and the response time on the ozone treatment time of the device in the example.

Then, dependence of the photosensitivity and the response time on the ozone treatment time was examined (FIG. 5). The ozone treatment time was defined as 80 minutes, 4 hours, and 24 hours. In FIG. 5, the ordinate on the left represents the photosensitivity and the ordinate on the right represents the attenuation time in the transient photocurrent response after turning off the light at 220 nm. From FIG. 5, a long response time was observed after the ozone treatment for 80 minutes. This is known as "persisting photoconduction" observed after turning off of light irradiation. The response time decreases as the ozone treatment time is extended further. It has been confirmed that the photosensitivity decreases more as the ozone treatment time is longer.

Figure 6:
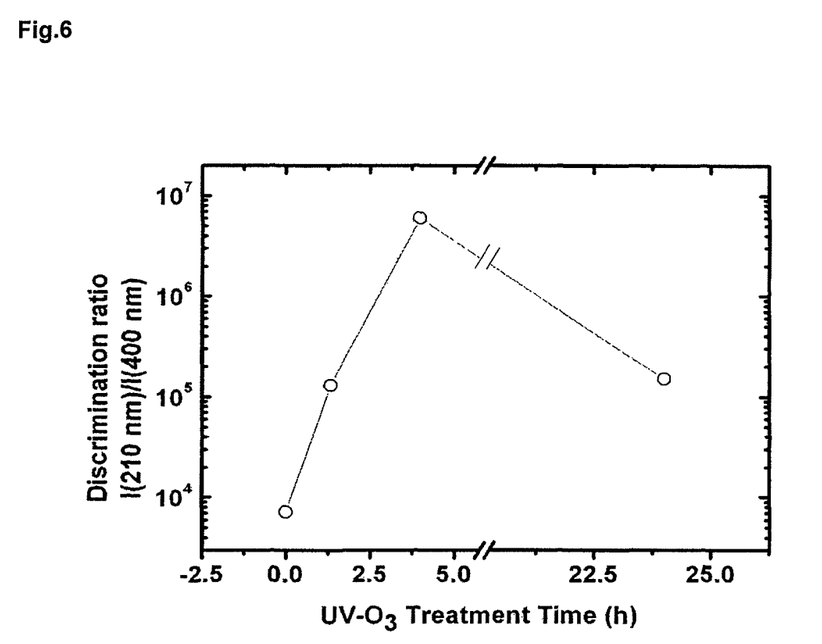
FIG. 6 is a graph showing the dependence of the UV/visible light blind ratio on the ozone treatment time of the device in the example.

Further, the dependence of UV/visible light blind ratio on ozone treatment time was examined (FIG. 6). The ozone treatment time was defined as 80 minutes, 4 hours, and 24 hours. The UV/visible light blind ratio is defined as a ratio of photocurrent values when a UV light and a visible light at wavelength of 210 nm and 400 nm of an identical light intensity are irradiated. In view of FIG. 6, it was confirmed that the UV/visible light blind ratio of the device after the ozone treatment was increased by about 1 to 3 digits when compared with the device in a state where the surface is hydrogenated.

Each of the abscissas in FIG. 3 to FIG. 6 shows the ozone treatment time. Each of the graphs is drawn while partially omitting the ozone treatment time between the scales 5.0 (h) and 22.5 (h) on the abscissa, where the value on the ordinate in the omitted section change scarcely.

Industrial Applicability

According to the present invention, a diamond UV sensor element further improved for the UV/visible light blind ratio than that of the existent diamond UV sensor element can be obtained by an extremely simple and convenient method. Further, according to the present invention, the photosensitivity and the response speed of the diamond UV sensor element can be controlled easily by changing the treatment time in the atmosphere containing ozone or active oxygen.

The obtained diamond UV sensor element can increase the UV/visible light blind ratio by about 1 to 3 digits compared with that using the existent diamond single crystal film hydrogenated at the surface as the light receiving portion and is useful, for example, as a combustion control monitor for industrial combustion furnaces, gas turbine engines, jet engines, etc., a flame sensor for flame detectors in association with fire detectors, or a UV sensor in UV light irradiation apparatus.

The invention claimed is:

1. A method of manufacturing a diamond UV sensor element using a diamond single crystal as a light receiving portion and detecting a light based on the change of electric resistance caused by a light irradiated to the light receiving portion, including;
   (1) a step of hydrogenating the surface of the diamond single crystal in an atmosphere substantially containing hydrogen, and
   (2) a step of forming a light receiving portion by exposing the hydrogenated surface of the diamond single crystal into an atmosphere containing ozone or active oxygen, in which
   the step (2) is carried out in an atmosphere containing ozone or active oxygen formed by introducing an oxygen gas into a chamber containing a diamond single crystal hydrogenated at the surface and irradiating a UV light thereto, and
   a UV/visible light blind ratio that is a ratio between the value of a photocurrent flowing under the irradiation of a UV light and the value of a photocurrent flowing under the irradiation of a visible light on the surface of diamond single crystal is controlled by controlling the concentration of bonded hydrogen at the surface of the diamond single crystal by controlling a UV light intensity or a UV light irradiation time.

2. The method of manufacturing a diamond UV sensor element according to claim 1, wherein the diamond single crystal is a diamond single crystal film disposed on a substrate.

* * * * *